United States Patent
Hung

(10) Patent No.: US 8,169,262 B2
(45) Date of Patent: *May 1, 2012

(54) METHOD FOR REDUCING OFFSET VOLTAGE OF OPERATIONAL AMPLIFIER AND THE CIRCUIT USING THE SAME

(75) Inventor: Tsan-Fu Hung, Changhua County (TW)

(73) Assignee: Princeton Technology Corporation, Hsin Tien, Taipei Country (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/177,119

(22) Filed: Jul. 6, 2011

(65) Prior Publication Data

US 2011/0260795 A1    Oct. 27, 2011

Related U.S. Application Data

(62) Division of application No. 12/648,946, filed on Dec. 29, 2009, now Pat. No. 7,999,616.

(30) Foreign Application Priority Data

Dec. 29, 2008 (TW) .............................. 97151208 A

(51) Int. Cl.
H03F 3/45 (2006.01)

(52) U.S. Cl. ........................................ 330/255; 330/260

(58) Field of Classification Search .................. 330/253, 330/255, 260, 261, 265, 267, 269, 271, 273
See application file for complete search history.

(56) References Cited

U.S. PATENT DOCUMENTS 5,907,259 A    5/1999    Yamada et al.
7,330,074 B2    2/2008    Kang et al.

Primary Examiner — Khanh V Nguyen
(74) Attorney, Agent, or Firm — Muncy, Geissler, Olds & Lowe, PLLC

(57) ABSTRACT

The invention provides an operational amplifier. In one embodiment, the operational amplifier includes an input stage circuit, a feedback circuit, a fixed stage circuit, and an output stage circuit. The input stage circuit receives a positive input voltage and a negative input voltage, and amplifies the positive input voltage and the negative input voltage to output a first positive output voltage and a first negative output voltage. The feedback circuit generates a reference positive output voltage equal to the first positive output voltage according to the positive input voltage and the negative input voltage. The fixed stage circuit equally amplifies the first negative output voltage and the reference positive output voltage to generate a second positive output voltage and a second negative output voltage. The output stage circuit generates an output voltage according to a difference voltage between the second positive output voltage and a second negative voltage.

11 Claims, 3 Drawing Sheets

METHOD FOR REDUCING OFFSET VOLTAGE OF OPERATIONAL AMPLIFIER AND THE CIRCUIT USING THE SAME

CROSS REFERENCE TO RELATED APPLICATIONS

This application is a Divisional of U.S. patent application Ser. No. 12/648,946, filed on Dec. 29, 2009 now U.S. Pat. No. 7,999,616 and entitled "Method for reducing offset voltage of operational amplifier and the circuit using the same", which claims priority of Taiwan Patent Application No. TW097151208, filed on Dec. 29, 2008; the entirety of all of which are hereby incorporated by reference.

BACKGROUND OF THE INVENTION

1. Field of the Invention

The invention relates to circuit designs, and more particularly to circuit designs of operational amplifiers.

2. Description of the Related Art

An operational amplifier is a high-gain voltage amplifier with two differential inputs and a single-ended output. Two differential input terminals of an operational amplifier respectively receive a positive input voltage and a negative input voltage. The operational amplifier then amplifies a difference voltage between the positive input voltage and the negative input voltage according to a high gain to generate an output voltage at an output terminal. Because the operational amplifier has a high gain and low manufacturing costs, the operational amplifier is widely used as component circuits for performing addition and multiplication operations in consumer electronic devices, industrial computers, and science instruments.

Because the operational amplifier amplifies a difference voltage between two differential input voltages, the common mode DC voltages of the two differential input terminals for receiving the differential input voltages must be at the same level. An offset voltage occurs when the common mode DC voltages of the two differential input terminals are different. The offset voltage induces errors in the difference voltage between the two differential input voltages, and causes errors in the output voltage of the operational amplifier after the difference voltage is amplified. Thus, operational amplifier designs attempt to reduce the offset voltage, to avoid errors in the output voltage of the operational amplifier.

An offset voltage of an operational amplifier is determined by two factors. One factor is a random offset voltage caused by circuit component mismatch induced during the manufacturing process of the operational amplifier. The other factor is a systematic offset voltage caused by circuit component asymmetry induced by circuit design of the operational amplifier. The random offset voltage is reduced when the size of the circuit components of the operational amplifier is reduced. The systematic offset voltage is reduced when the circuit component asymmetry of the operational amplifier is reduced.

The offset voltage of an operational amplifier is calculated according to the following algorithm:

$$\sigma^2(V_{OS}) = \sigma^2(\Delta V_{Tp}) + \frac{\beta_n}{\beta_p}\sigma^2(\Delta V_{Tn}) + \frac{I}{2\beta_p}\left|\frac{\sigma^2(\Delta\beta_p)}{\beta_p} + \frac{\sigma^2(\Delta\beta_n)}{\beta_n}\right| +$$

-continued $$\sigma^2(\Delta\lambda_p)\left(\frac{V_{DSp}}{1+\lambda_p V_{DSp}}\right)^2 + \sigma^2(\Delta\lambda_n)\left(\frac{V_{DSn}}{1+\lambda_n V_{DSn}}\right)^2.$$

$\beta_p$ and $\beta_n$ are trans-conductance parameters of a differential input PMOS transistor and a load NMOS transistor, I is bias current, $\sigma^2(\Delta V_{Tp})$ is a square of a standard deviation of a threshold voltage of PMOS transistors, $\sigma^2(\Delta V_{Tn})$ is a square of a standard deviation of a threshold voltage of NMOS transistors. $\sigma^2(\Delta\beta_p)$ is a square of a standard deviation of a trans-conductance of PMOS transistors, $\sigma^2(\Delta\beta_n)$ is a square of a standard deviation of a trans-conductance of NMOS transistors, $\sigma^2(\Delta\lambda_p)$ is a square of a standard deviation of a channel length modulation parameter of PMOS transistors, and $\sigma^2(\Delta\lambda_n)$ is a square of a standard deviation of a channel length modulation parameter of NMOS transistors. $V_{DSp}$ is a drain-to-source voltage of PMOS transistors, and $V_{DSn}$ is a drain-to-source voltage of NMOS transistors. The third term of the equation is reduced by reducing the bias current I, the second term of the equation is reduced by extending the channel length of the NMOS transistors, and the first term of the equation is reduced by lowering circuit asymmetry. The systematic offset voltage is therefore mainly caused by the drain-to-source voltage difference $\Delta V_{DS}$ between the two differential input PMOS transistors.

Referring to FIG. 1, a circuit diagram of a conventional operational amplifier 100 is shown. The operational amplifier 100 comprises differential input PMOS transistors 102 and 104, and load NMOS transistors 106 and 108. The size of the PMOS transistors 102 and 104 and the NMOS transistors 106 and 108 can be increased to reduce the random offset voltage. The load NMOS transistors 106 and 108, however, have different coupling relations, inducing circuit asymmetry of the operational amplifier 100, causing differences between the drain-to-source voltages of the differential input PMOS transistors 102 and 104, and inducing the systematic offset voltage. The operational amplifier 100 therefore has high offset voltage and poor performance.

Referring to FIG. 2, a circuit diagram of another conventional operational amplifier 200 is shown. The operational amplifier 200 comprises differential input PMOS transistors 202 and 204, and load NMOS transistors 206 and 208. The NMOS transistors 206 and 208 have the same coupling relations to allow the operational amplifier to have a symmetrical circuit structure. The drain-to-source voltages of the PMOS transistors 202 and 204 are therefore almost equal, reducing the offset voltage of the operational amplifier 200. In comparison to the operational amplifier 100 shown in FIG. 1, the operational amplifier 200 has lower gain due to the diode connection of the load NMOS transistors 206 and 208. An operational amplifier with a high gain and a reduced offset voltage is therefore required.

BRIEF SUMMARY OF THE INVENTION

The invention provides an operational amplifier. In one embodiment, the operational amplifier comprises an input stage circuit, a feedback circuit, a fixed stage circuit, and an output stage circuit. The input stage circuit receives a positive input voltage and a negative input voltage at a positive differential input terminal and a negative differential input terminal, and amplifies the positive input voltage and the negative input voltage to output a first positive output voltage at a first node and a first negative output voltage at a second node. The feedback circuit generates a reference positive output voltage equal to the first positive output voltage at a third node according to the positive input voltage and the negative input voltage. The fixed stage circuit equally amplifies the first negative output voltage and the reference positive output voltage to generate a second positive output voltage at a fourth node and a second negative output voltage at a fifth node. The output stage circuit generates an output voltage at an output terminal according to a difference voltage between the second positive output voltage and a second negative voltage. The fixed stage circuit has a symmetrical circuit structure to clamp offset voltages of the second node and the third node at the same level.

The invention provides a method for reducing an offset voltage of an operational amplifier. First, a positive input voltage and a negative input voltage are received via a positive differential input terminal and a negative differential input terminal of an input stage circuit. The positive input voltage and the negative input voltage are then amplified to output a first positive output voltage and a first negative output voltage at a first node and a second node of the input stage circuit. A reference positive output voltage equal to the first positive output voltage is then generated at a third node according to the positive input voltage and the negative input voltage with a feedback circuit. The first negative output voltage and the reference positive output voltage are then equally amplified to generate a second positive output voltage at a fourth node and a second negative output voltage at a fifth node with a fixed stage circuit. An output voltage is then generated at an output terminal according to a difference voltage between the second positive output voltage and a second negative voltage with an output stage circuit. The fixed stage circuit has a symmetrical circuit structure to clamp offset voltages of the second node and the third node at the same level.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
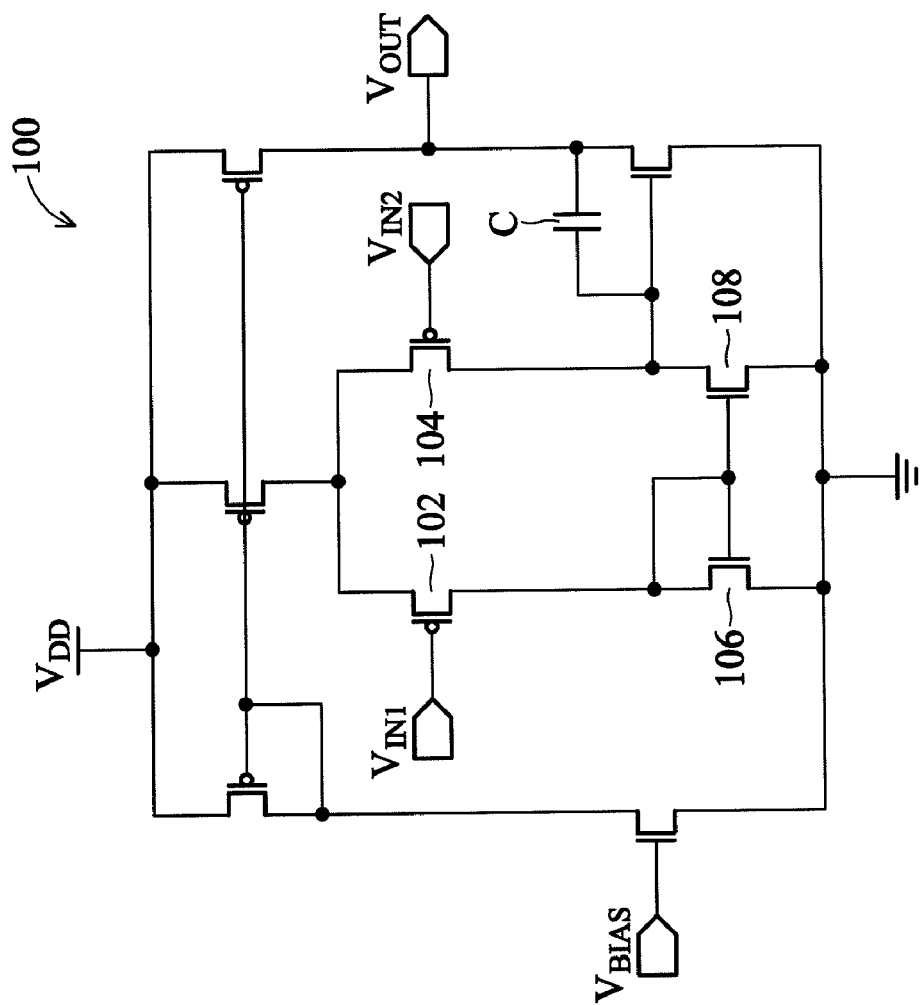
FIG. 1 is a circuit diagram of a conventional operational amplifier.
Figure 2:
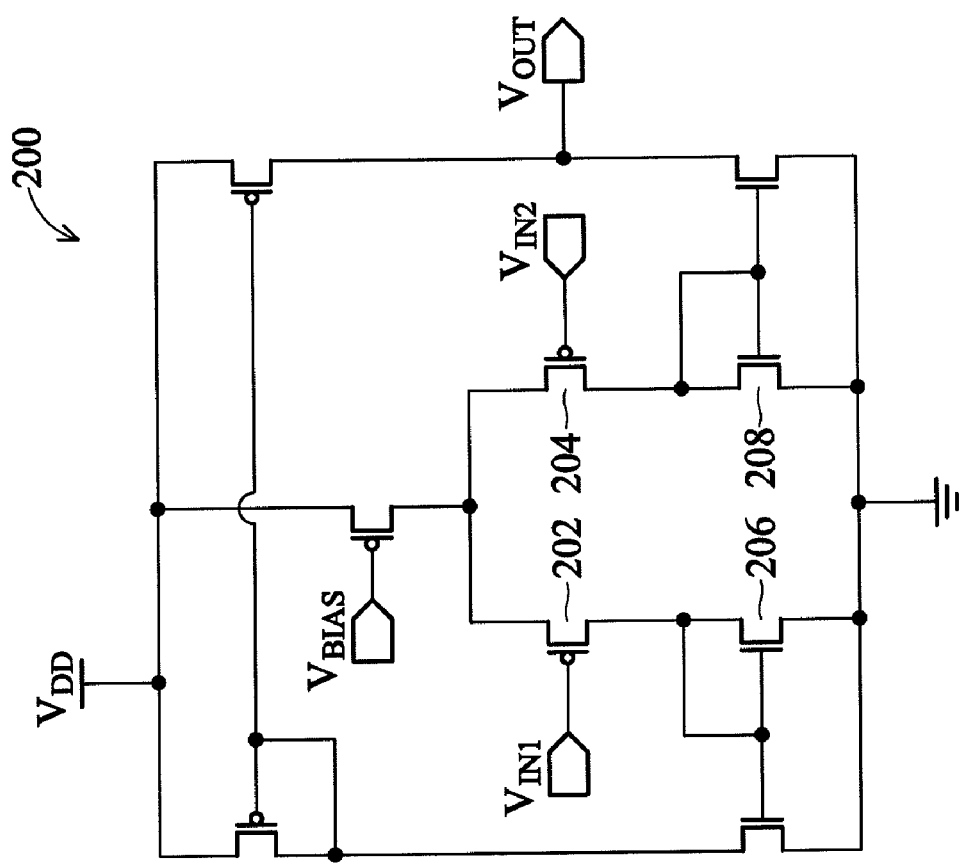
FIG. 2 is a circuit diagram of another conventional operational amplifier.
Figure 3:
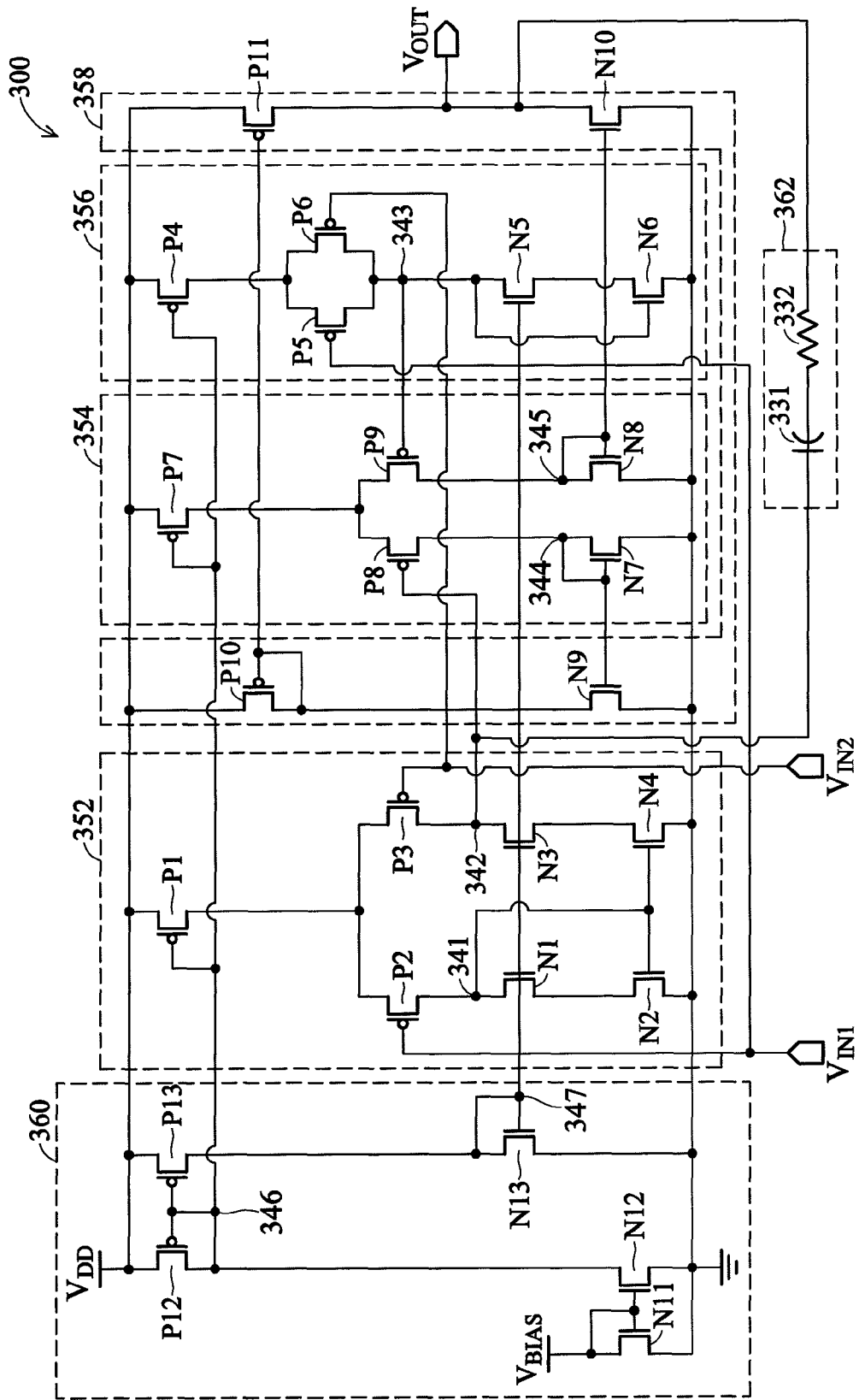
FIG. 3 is a circuit diagram of an operational amplifier according to the invention.

Referring to FIG. 3, a circuit diagram of an operational amplifier 300 according to the invention is shown. In one embodiment, the operational amplifier 300 comprises an input stage circuit 352, a fixed stage circuit 354, a feedback circuit 356, an output stage circuit 358, a bias circuit 360, and a compensation circuit 362. The input stage circuit 352 receives a positive input voltage $V_{IN1}$ and a negative input voltage $V_{IN2}$, and amplifies the positive input voltage $V_{IN1}$ and the negative input voltage $V_{IN2}$ to respectively generate a first positive output voltage $V_{341}$ at a first node 341 and a first negative output voltage $V_{342}$ at a second node 342. Because the coupled relationships between the NMOS transistors N1 and N2 of the input stage circuit 352 are different from those of the NMOS transistors N3 and N4 of the input stage circuit 352, the operational amplifier 300 has a gain higher than that of the conventional operational amplifier 200 shown in FIG. 2.

A portion of the input stage circuit 352 generates the first positive output voltage $V_{341}$. The feedback circuit 356 has a similar circuit structure with that of the portion of the input stage circuit 352 generating the first positive output voltage $V_{341}$. The feedback circuit 356 therefore can directly generate a reference output voltage $V_{343}$ equal to the first positive output voltage $V_{341}$ at a third node 343 according to the positive input voltage $V_{IN1}$ and the negative input voltage $V_{IN2}$ without been coupled to the first node 341. The fixed stage circuit 354 then receives the first negative output voltage $V_{342}$ at the second node 342 and the reference positive voltage $V_{343}$ at the third node 343, and respectively amplifies the first negative output voltage $V_{342}$ and the reference positive voltage $V_{343}$ to generate a second negative output voltage $V_{344}$ at a fourth node 344 and a second positive output voltage $V_{345}$ at a fifth node 345. Because the reference positive voltage $V_{343}$ at the third node 343 is equal to the first positive output voltage $V_{341}$ at the first node, the fixed stage circuit 354 mimics, amplifying the first positive output voltage $V_{341}$ at the first node 341 to generate the second positive output voltage $V_{345}$ at the fifth node 345.

Finally, the output stage circuit 358 receives the second negative output voltage $V_{344}$ at the fourth node 344 and the second positive output voltage $V_{345}$ at the fifth node 345, and generates an output voltage $V_{OUT}$ at an output terminal according to a voltage difference between the second negative output voltage $V_{344}$ and the second positive output voltage $V_{345}$.

In addition, the operational amplifier 300 further comprises a bias circuit 360 and a compensation circuit 362. The bias circuit 360 provides the input stage circuit 352, the feedback circuit 356, and the fixed stage circuit 354 with a high voltage $V_{DD}$, a first clamp voltage $V_{346}$, and a second clamp voltage $V_{347}$. The compensation circuit 362 is coupled between the second node 342 and the output terminal $V_{OUT}$ of the operational amplifier 300, and maintains frequency stability of the operational amplifier 300.

Because the fixed stage circuit 354 has a symmetrical differential dual-input circuit structure, the PMOS transistors P8 and P9 of the fixed stage circuit 354 have the same common mode DC voltages. Because the gate of the PMOS transistor P8 is coupled to the second node 342 of the input stage circuit 352, and the gate of the PMOS transistor P9 is coupled to the third node 343 of the feedback circuit 356, the second node 342 and the third node 343 therefore have the same DC voltages. In addition, because the reference positive voltage $V_{343}$ at the third node 343 of the feedback circuit 356 is further equal to the first positive output voltage $V_{341}$ at the first node 341, the DC voltages of the first node, the third node 343, and the second node 342 are the same. Thus, although the NMOS transistors N1 and N2 have different coupled relationships between those of the NMOS transistors N3 and N4, the output nodes 341 and 342 of the input stage circuit 352 have the same DC voltages. The offset voltage between the two differential input terminals of the operational amplifier 300 is therefore eliminated, thus improving the performance of the operational amplifier 300. The operational amplifier 300 therefore has a high gain and a low offset voltage, and therefore has a better performance than that of the conventional operational amplifiers 100 and 200. The detailed circuit structures of the input stage circuit 352, the feedback circuit 356, and the fixed stage circuit 354 are illustrated in the following paragraphs.

In one embodiment, the input stage circuit 352 comprises PMOS transistors P1, P2, and P3, and NMOS transistors N1, N2, N3, and N4. The PMOS transistor P1 has a source coupled to the high voltage $V_{DD}$ and a gate coupled to the first clamp voltage $V_{346}$. The gates of the PMOS transistors P2 and P3 are the differential input terminals of the input stage circuit 352. The PMOS transistor P2 is coupled between the drain of the PMOS transistor P1 and the first node 341. The PMOS transistor P2 has a gate coupled to the positive input terminal $V_{IN1}$. The PMOS transistor P3 is coupled between the drain of the PMOS transistor P1 and the second node 342. The PMOS transistor P3 has a gate coupled to the negative input terminal $V_{IN2}$. The NMOS transistors N1 and N2 are load transistors of the positive differential terminal of the input stage circuit 352. The NMOS transistors N1 and N2 are connected in series between the drain of the PMOS transistor P2 and a ground voltage. The drain of the NMOS transistor N1 is coupled to the gate of the NMOS transistor N2, and the gate of the NMOS transistor N1 is coupled to the second clamp voltage $V_{347}$. The NMOS transistors N3 and N4 are load transistors of the negative differential terminal of the input stage circuit 352. The NMOS transistors N3 and N4 are connected in series between the drain of the PMOS transistor P3 and the ground voltage. The gate of the NMOS transistor N4 is coupled to the gate of the NMOS transistor N2, and the gate of the NMOS transistor N3 is coupled to the second clamp voltage $V_{347}$.

In one embodiment, the feedback circuit 356 comprises PMOS transistors P4, P5, and P6, and NMOS transistors N5 and N6. The source of the PMOS transistor P4 is coupled to the high voltage $V_{DD}$, and the gate of the PMOS transistor P4 is coupled to the first clamp voltage $V_{346}$. The PMOS transistor P5 is coupled between the drain of the PMOS transistor P4 and the third node 343. The gate of the PMOS transistor P5 is coupled to the positive input terminal $V_{IN1}$. The PMOS transistor P6 is coupled between the drain of the PMOS transistor P4 and the third node 343. The gate of the PMOS transistor P6 is coupled to the negative input terminal $V_{IN2}$. The NMOS transistors N5 and N6 are connected in series between the third node 343 and the ground voltage. The drain of the NMOS transistor N5 is coupled to the gate of the NMOS transistor N6, and the gate of the NMOS transistor N5 is coupled to the second clamp voltage $V_{347}$. The circuit components of the feedback circuit 356 corresponds to the circuit components of the positive input terminal of the input stage circuit 352, and the length-to-width ratios of the circuit components of the feedback circuit 356 are proportional to those of the corresponding circuit components of the input stage circuit 352. In one embodiment, the PMOS transistor P1 has length-to-width ratio that is two times that of the PMOS transistor P4. The length-to-width ratios of the NMOS transistors N1, N3, and N5 are equal, and the length-to-width ratios of the NMOS transistors N2, N4, and N6 are equal.

In one embodiment, the fixed stage circuit 354 comprises PMOS transistors P7, P8, and P9 and NMOS transistors N7 and N8. The PMOS transistor P7 has a source coupled to the high voltage $V_{DD}$, and a gate coupled to the first clamp voltage $V_{346}$. The PMOS transistor P8 is coupled between the drain of the PMOS transistor P7 and the fourth node 344. The gate of the PMOS transistor P8 is coupled to the second node 342. The PMOS transistor P9 is coupled between the drain of the PMOS transistor P7 and the fifth node 345. The gate of the PMOS transistor P9 is coupled to the third node 343. The NMOS transistor N7 is coupled between the drain of the NMOS transistor N8 and the ground voltage. The gate of the NMOS transistor N7 is coupled to the drain of the NMOS transistor N7. The NMOS transistor N8 is coupled between the drain of the NMOS transistor N9 and the ground voltage. The gate of the NMOS transistor N8 is coupled to the drain of the NMOS transistor N8.

In one embodiment, the output stage circuit 358 comprises PMOS transistors P10 and P11 and NMOS transistors N9 and N10. The PMOS transistor P10 has a source coupled to the high voltage $V_{DD}$, and a gate coupled to a drain thereof. The PMOS transistor P11 has a source coupled to the high voltage $V_{DD}$, and a gate coupled to the gate of the PMOS transistor P10. The NMOS transistor N9 is coupled between the drain of the PMOS transistor P10 and the ground voltage. The gate of the NMOS transistor N9 is coupled to the fourth node 344. The NMOS transistor N10 is coupled between the drain of the PMOS transistor P11 and the ground voltage. The gate of the NMOS transistor N10 is coupled to the fifth node 345. The drain of the NMOS transistor N10 is coupled to the output terminal $V_{OUT}$.

In one embodiment, the bias circuit 360 comprises PMOS transistors P12 and P13 and NMOS transistors N11, N12, and N13. The PMOS transistors P12 has a source coupled to the high voltage $V_{DD}$, and a gate and a drain coupled to the sixth node 346. The PMOS transistors P13 has a source coupled to the high voltage $V_{DD}$, and a gate coupled to the sixth node 346. The NMOS transistors N11 has a source coupled to the ground voltage, and a gate and a drain coupled to a bias voltage $V_{BIAS}$. The NMOS transistors N12 is coupled between the drain of the PMOS transistor P12 and the ground voltage. The NMOS transistor N13 has a source coupled to the ground voltage, and a gate and a drain coupled to the seventh node 347. The sixth node 346 and the seventh node 347 respectively outputs the first clamp voltage $V_{346}$ and the second clamp voltage $V_{347}$. In one embodiment, the compensation circuit 362 comprises a capacitor 331 and a resistor 332 connected in series between the second node 342 and the output terminal $V_{OUT}$.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for reducing an offset voltage of an operational amplifier, comprising:
   receiving a positive input voltage and a negative input voltage via a positive differential input terminal and a negative differential input terminal of an input stage circuit;
   amplifying the positive input voltage and the negative input voltage to output a first positive output voltage and a first negative output voltage at a first node and a second node of the input stage circuit;
   generating a reference positive output voltage equal to the first positive output voltage at a third node according to the positive input voltage and the negative input voltage with a feedback circuit;
   equally amplifying the first negative output voltage and the reference positive output voltage to generate a second positive output voltage at a fourth node and a second negative output voltage at a fifth node with a fixed stage circuit; and generating an output voltage at an output terminal according to a difference voltage between the second positive output voltage and a second negative voltage with an output stage circuit,
wherein the fixed stage circuit has a symmetrical circuit structure to clamp offset voltages of the second node and the third node at the same level.

2. The method as claimed in claim 1, wherein components of the feedback circuit have corresponding components in the input stage circuit, and length-to-width ratios of the components of the feedback circuit are proportional to length-to-width ratios of the corresponding components of the input stage circuit.

3. The method as claimed in claim 1, wherein the method further comprises providing a high voltage, a first clamp voltage, and a second clamp voltage to the input stage circuit, the feedback circuit, and the fixed stage circuit with a bias circuit.

4. The method as claimed in claim 1, wherein the method further comprises maintaining frequency stability of the operational amplifier with a compensation circuit coupled between the second node and the output terminal.

5. The method as claimed in claim 3, wherein the input stage circuit comprises:
a first PMOS transistor having a source coupled to the high voltage, and a gate coupled to the first clamp voltage;
a second PMOS transistor coupled between the first node and the drain of the first PMOS transistor, which has a gate coupled to the positive input terminal;
a third PMOS transistor coupled between the second node and the drain of the first PMOS transistor, which has a gate coupled to the negative input terminal;
a first NMOS transistor and a second NMOS transistor connected in series between a ground voltage and the drain of the second PMOS transistor, wherein the drain of the first NMOS transistor is coupled to the gate of the second NMOS transistor, and the gate of the first NMOS transistor is coupled to the second clamp voltage; and
a third NMOS transistor and a fourth NMOS transistor connected in series between the drain of the third PMOS transistor and the ground voltage, wherein the gate of the third NMOS transistor is coupled to the second clamp voltage, and the gate of the fourth NMOS transistor is coupled to the gate of the second NMOS transistor.

6. The method as claimed in claim 1, wherein the feedback circuit comprises:
a fourth PMOS transistor having a source coupled to the high voltage, and a gate coupled to the first clamp voltage;
a fifth PMOS transistor coupled between the drain of the fourth PMOS transistor and the third node, a gate of the fifth PMOS transistor is coupled to the positive input terminal;
a sixth PMOS transistor coupled between the drain of the fourth PMOS transistor and the third node, a gate of the sixth PMOS transistor is coupled to the negative input terminal;
a fifth NMOS transistor and a sixth NMOS transistor connected in series between the third node and a ground voltage, wherein the drain of the fifth NMOS transistor is coupled to the gate of the sixth NMOS transistor, and the gate of the fifth NMOS transistor is coupled to the second clamp voltage.

7. The method as claimed in claim 6, wherein the first PMOS transistor has a length-to-width ratio that is two times that of the fourth PMOS transistor, the length-to-width ratios of the first NMOS transistor, the third NMOS transistor, and the fifth NMOS transistor are equal, and the length-to-width ratios of the second NMOS transistor, the fourth NMOS transistor, and the sixth NMOS transistor are equal.

8. The method as claimed in claim 3, wherein the fixed stage circuit comprises:
a seventh PMOS transistor having a source coupled to the high voltage, and a gate coupled to the first clamp voltage;
an eighth PMOS transistor coupled between the drain of the seventh PMOS transistor and the fourth node, wherein a gate of the eight PMOS transistor is coupled to the second node;
a ninth PMOS transistor coupled between the drain of the seventh PMOS transistor and the fifth node, wherein a gate of the ninth PMOS transistor is coupled to the third node;
a seventh NMOS transistor coupled between the drain of the eighth PMOS transistor and a ground voltage, wherein the gate and the drain of the seventh NMOS transistor are coupled together; and
an eighth NMOS transistor coupled between the drain of the ninth PMOS transistor and the ground voltage, wherein the gate and the drain of the eighth NMOS transistor are coupled together.

9. The method as claimed in claim 1, wherein the output stage circuit comprises:
a tenth PMOS transistor having a source coupled to a high voltage, wherein the gate and drain of the tenth PMOS transistor are coupled together;
a eleventh PMOS transistor having a source coupled to the high voltage, and a gate coupled to the gate of the tenth PMOS transistor;
a ninth NMOS transistor coupled between the drain of the tenth PMOS transistor and a ground, wherein a gate of the ninth NMOS transistor is coupled to the fourth node; and
a tenth NMOS transistor coupled between the drain of the eleventh PMOS transistor and the ground voltage, wherein a gate of tenth NMOS is coupled to the fifth node, and a drain is coupled to the output terminal.

10. The method as claimed in claim 2, wherein the compensation circuit comprises:
a capacitor coupled between the second node and a sixth node; and
a resistor coupled between the sixth node and the output terminal.

11. The method as claimed in claim 3, wherein the bias circuit comprises:
a twelfth PMOS transistor having a source coupled to the high voltage, wherein the gate and the drain of the twelfth PMOS transistor are coupled together;
a thirteen PMOS transistor having a source coupled to the high voltage, and a gate coupled to the gate of the twelfth PMOS transistor;
a eleventh NMOS transistor having a source coupled to a ground voltage, wherein the gate and the drain of the eleventh NMOS transistor is coupled to a bias voltage;
a twelfth NMOS transistor coupled between the drain of the twelfth PMOS transistor and the ground voltage; and
a thirteenth NMOS transistor having a source coupled to the ground voltage, wherein the drain and the gate of the thirteenth NMOS transistor are coupled together,
wherein the voltage of the drain of the twelfth PMOS transistor is the first clamp voltage, and the voltage of the drain of the thirteenth NMOS transistor is the second clamp voltage.

* * * * *